United States Patent [19]
Wu et al.

[11] Patent Number: 5,448,581
[45] Date of Patent: Sep. 5, 1995

[54] CIRCULAR GRATING LASERS

[75] Inventors: Chun-Meng Wu, Montreal; Toshihiko Makino, Nepean, both of Canada

[73] Assignee: Northern Telecom Limited, Quebec, Canada

[21] Appl. No.: 158,543

[22] Filed: Nov. 29, 1993

[51] Int. Cl.[6] .............................................. H01S 3/19
[52] U.S. Cl. ...................................... 372/45; 372/44; 372/46
[58] Field of Search ...................... 372/44, 45, 46, 50

[56] References Cited

U.S. PATENT DOCUMENTS

| | | | |
|---|---|---|---|
| 4,743,083 | 5/1988 | Schimpe | 350/96.19 |
| 5,052,016 | 9/1991 | Mahbobzadeh et al. | 372/45 |
| 5,164,956 | 11/1992 | Lang | 372/96 |

OTHER PUBLICATIONS

"Binary phase Fresnel lenses for generation of two-dimensional beam arrays", Rastani et al., Applied Optics, vol. 30, No. 11, 10 Apr. 1991, pp. 1347–1354.

"GaAs/AlGaAs Grating Surface-Emitting Diode Lasers on Si Substrates", Connolly et al, Electronics Letters, vol. 25, No. 14, Jul. 6 1989, pp. 901–902.

"Optically Pumped Surface-Emitting DFB GaInAsP/InP Lasers with Circular Grating", Wu et al, Electronics Letters, vol. 27, No. 20, Sep. 26, 1991, pp. 1819–1820.

Primary Examiner—Rodney B. Bovernick
Assistant Examiner—Robert E. Wise
Attorney, Agent, or Firm—George MacGregor

[57] ABSTRACT

A surface emitting, circular grating, semiconductor laser. Gain is generated by injecting current into an active, annular mesa region which surrounds a central, circular region having a circular grating for surface emission. The annular mesa region is surrounded by an outer annular region in which is etched a first order grating for creating feedback. Methods of fabricating the circular grating laser are also described.

25 Claims, 19 Drawing Sheets

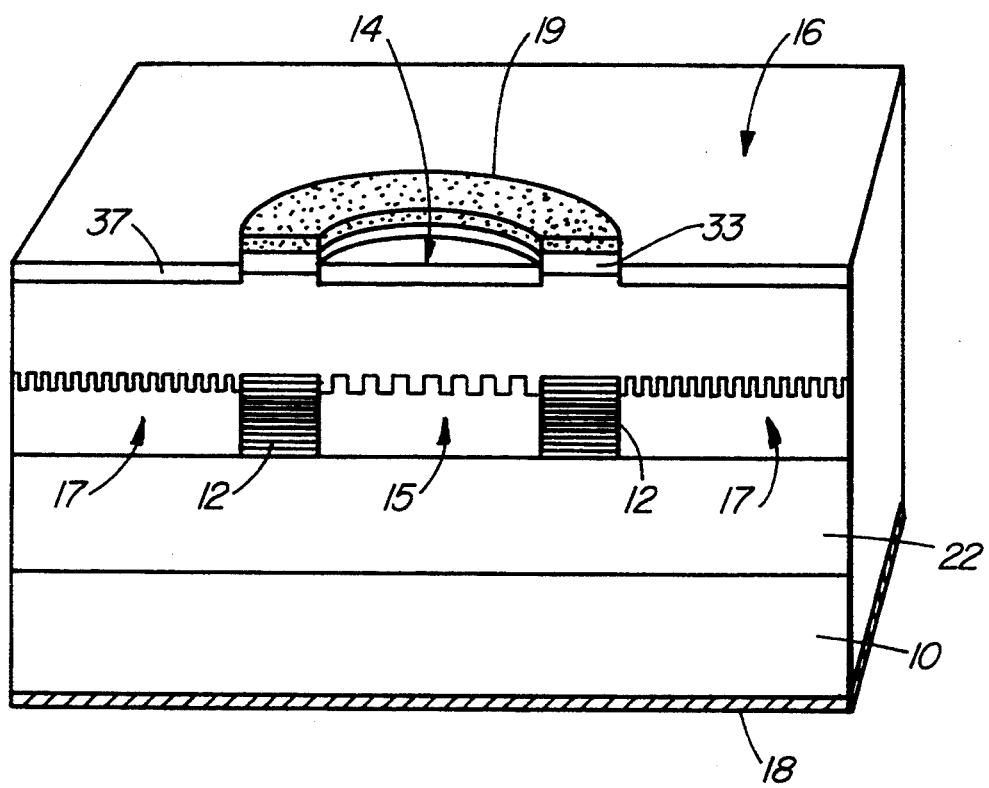
FIG. IK

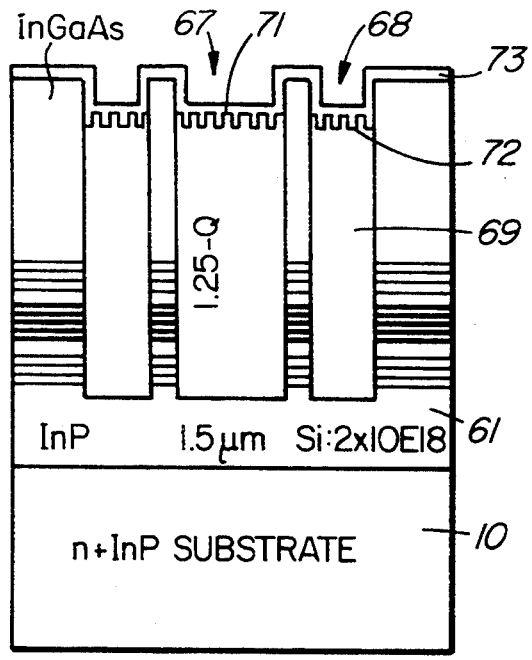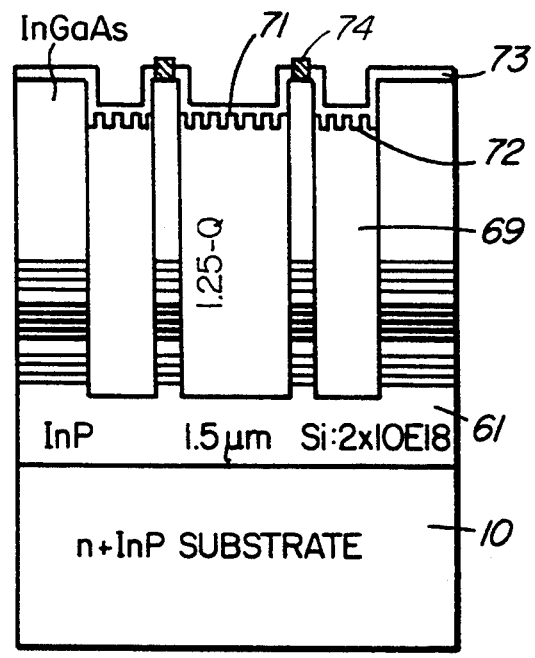
FIG. 3E
FIG. 3F
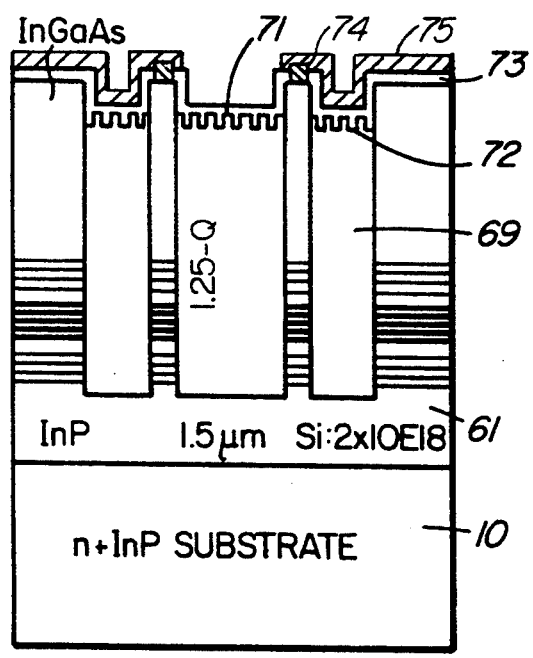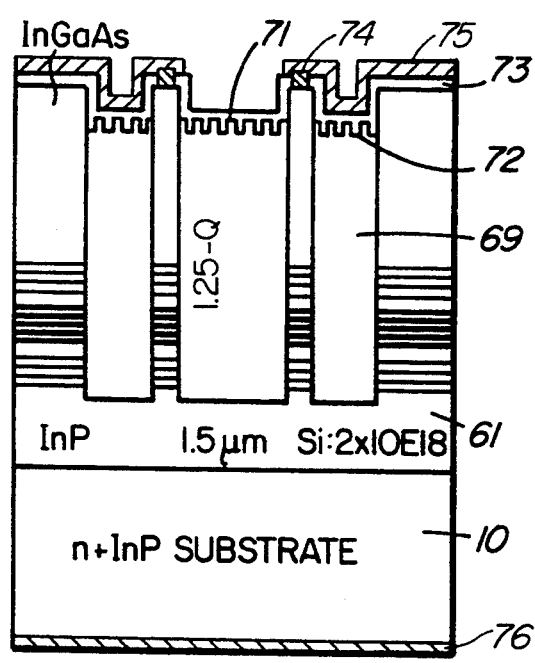
FIG. 3G
FIG. 3H

CIRCULAR GRATING LASERS

FIELD OF THE INVENTION

This invention relates to surface emitting, semiconductor lasers and more particularly to a circular grating, surface emitting laser having an annular active region which surrounds a central region having a second order grating for surface emission. An annular region having a first order grating for creating feedback surrounds the active region. The invention also relates to methods of fabricating such lasers.

BACKGROUND OF THE INVENTION

Semiconductor lasers play an extremely important role in fiber optic communication systems. By selecting the appropriate semiconductor material, conventionally III–V alloy compounds, lasers which generate emission in the wavelength range 0.8 μm to 1.7 μm can be fabricated. Of particular interest for long haul communication systems are lasers having an emission wavelength in the range 1.3 to 1.55 μm as these wavelengths are particularly well matched to transmission characteristics of low loss single mode fibers. Shorter wavelength devices i.e., in the order of 0.9 μm are acceptable for multi-mode short distance transmission such as local area computer networks and circuit board and electronic module interconnections. Fabry-Perot lasers and, more recently, distributed feedback (DFB) lasers have been investigated extensively and device architectures have developed to the point where efficient, single mode, edge-emitting lasers are readily available. Growing out of these developments and more particularly developments in connection with the DFB lasers, i.e., lasers having periodic perturbations at the surface or buried within the structure, is the surface emitting laser (SEL) in which the light is emitted normally to the surface of the device. Because the output beam is emitted normally to the surface of the device, surface emitting lasers can be processed utilizing techniques developed for integrated circuit fabrication. Further, device testing can be performed in wafer form, i.e. it is not necessary to cleave each individual device from the wafer in order to test as is the case for edge emitters. This results in reduced processing costs and improved reliability. Since the SEL may be located anywhere on an optoelectronic integrated circuit, i.e. not restricted to an edge, the architecture is well suited to the integration of the laser and the requisite drive circuitry on a common substrate.

PRIOR ART

Surface emitting lasers utilize surface or buried periodic perturbations or diffraction grating having both first order and second order gratings. The first order gratings provide Bragg reflections to the light generated in the active region resulting in the required feedback for lasing action. The second order gratings provide Bragg reflections to the generated light in the plane of the cavity and deflect part of the light perpendicular to the cavity and the perpendicularly deflected light leads to surface emission. The pitch of the gratings is tailored to match the wavelength of the light generated by the laser according to the following formula:

$$\Lambda = \frac{\lambda}{n} \quad (1)$$

where $\Lambda$=pitch, $\lambda$=emission wavelength and n=index of refraction of the material. The above formula is for the second order grating; the first order grating having the following formula:

$$\Lambda = \frac{\lambda}{2n} \quad (2)$$

Circular gratings as a means of confining and directing the output beam of semiconductor lasers have been disclosed previously. In U.S. Pat. No. 4,743,083 which issued May 10, 1988 to Robert M. Schimpe two circular grating configurations are disclosed. In the first structure (FIG. 1A) the first-order grating region incorporates the active region. Analysis of this structure indicates that a very high threshold current is required which leads to an inefficient device. The second embodiment (FIGS. 12A and 16A) discloses a configuration in which the central, second-order grating region incorporates the active region. Although this configuration leads to a lower threshold current than the previously described structure the phase variation due to carrier injection causes instability in the lasing wavelength and affects the shape of the output beam.

In U.S. Pat. No. 5,164,956 which issued Nov. 17, 1992 to Robert J. Lang there is disclosed a multiperiod-grating surface emitting laser. FIG. 5b of the '956 patent shows a structure having a central, circular active region surrounded by a first order circular grating which in turn is surrounded by a circular second order grating. Since the second order grating, which diffracts light out of the device, is outside of both the active area and the device contact, there is a central blocking section. This results in a non uniform output beam pattern.

SUMMARY OF THE INVENTION

The present invention overcomes the limitations of the prior art by providing a circular grating laser in which the active region is annular rather than purely circular. This architecture allows for a circular grating to be located inside the active region and hence the output beam is not blocked by the active region and associated contact. A first order grating is formed in an annular region which is positioned concentrically with and surrounds the active region. This configuration results in the separation of the lasing action and the surface emission. It also permits tailoring of the individual regions and particularly the central region to optimize the output beam quality. It is also possible, through selection of an appropriate circular grating such as a binary-phase Fresnel lens, to focus the emitted beam.

Therefore in accordance with a first aspect of the present invention there is provided a surface emitting, semiconductor lasing device comprising a substrate and an annular active region on the substrate, the active region containing material capable of generating light and gain for lasing action. A central, circular region has a circular grating to effect surface emission. An annular region surrounds the active region, the annular region having a first order grating to reflect light generated in the active region toward the central region. Contacts are provided on the active region for injecting current to initiate lasing action. The central circular grating may be a second or higher order grating or a binary-phase Fresnel lens.

In accordance with a second aspect of the invention there is provided a method of fabricating a surface emitting, semi-conductor lasing device. The method includes the epitaxial growth of semi-conducting material on a substrate, the epitaxial material including an active layer capable of generating light and gain for lasing action. The material is then selectively etched to form an annular mesa of active material with an etched circular central region and an annular etched region surrounding the active region. Semi-insulating material is then grown in the etched regions. Circular gratings are formed in the semi-insulating material including a first order grating in the material surrounding the active region. A cladding layer may be regrown on top of the grating regions before contacts are formed on the substrate and the active region. In a specific embodiment the central circular region includes a second order grating.

In accordance with a further aspect of the invention there is provided a method of fabricating a surface emitting, semi-conductor lasing device comprising the steps of: a) growing doped semi-conductor material on a doped substrate; b) forming circular gratings on said grown material, the gratings including a circular grating in a central region and a first order grating in an annular region surrounding the central circular region; c) growing active material capable of generating light and gain for lasing action on said circular gratings, the active material including material of an opposite polarity type to the polarity type of the substrate; d) etching the active material to form an annular mesa active region with an etched central circular region and an etched annular region, the central region being aligned with the central circular grating and the annular etched region being aligned with the first order grating; e) regrowing the etched regions with semi-insulating material; f) regrowing doped semi-conducting material on the semi-insulating material and annular active region, the doped regrown material being of the opposite type as the substrate; g) etching an annular current confining ridge in the doped regrown material, the etched ridge being aligned with the annular active region and; h) forming contacts on the substrate and etched ridge.

In accordance with yet another aspect of the invention there is provided a method of fabricating a surface emitting semi-conductor lasing device comprising the steps of: a) growing semi-conducting material on a substrate, the semi-conducting material including an active material capable of generating light and gain for lasing action and a capping layer on the active layer; b) etching an annular mesa in the capping layer so as to leave a central circular etched surface and an etched surface surrounding the mesa; c) forming circular gratings on the etched surfaces including a first order grating in the etched surface surrounding the mesa; d) depositing a protective dielectric layer on the circular gratings and; e) forming contacts on the substrate and the annular mesa.

DESCRIPTION OF THE DRAWINGS

The invention will now be described in greater detail with reference to the appended drawings in which:

FIGS. 1A to 1K illustrate procedural steps in fabricating a first embodiment of the invention;

FIGS. 3A to 3H illustrate processing steps for a third embodiment of the invention;

DETAILED DESCRIPTION OF THE INVENTION

Figure 1A:
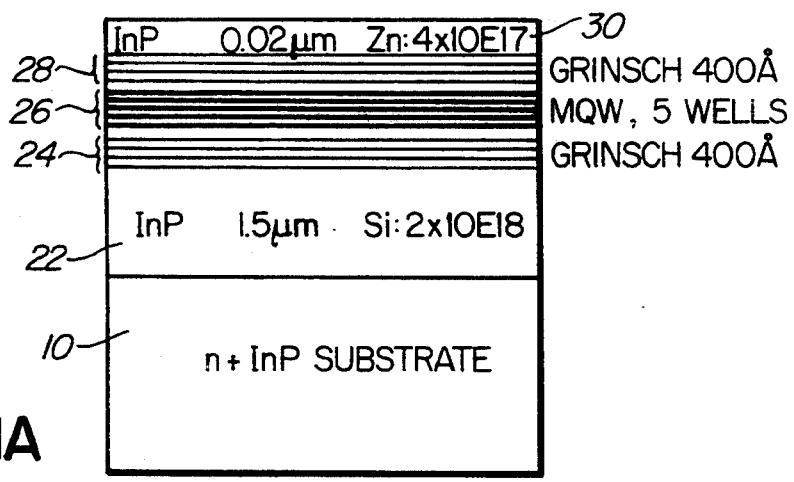

Referring initially to FIG. 1K there is shown a perspective, cross-sectional view of a circular grating laser according to one aspect of the present invention. The device includes substrate 10, active region 12, central region 14 including second order grating 15, annular region 16 including first order grating 17, N contact 18 and P contact 19. The processing steps involved in fabricating the structure of FIG. 1K will now be discussed having regard to FIGS. 1A to FIG. 1K.

FIG. 1A shows an InP substrate onto which has been grown by known crystal growth techniques (e.g. Metal-Organic Chemical Vapor Deposition—MOCVD) a 1.5 $\mu$m N layer 22 of InP, a 400 Å graded index separate confinement layer 24 and a plurality of quantum wells 26. As shown in FIG. 1A, five wells are grown each separated by a barrier layer. The number of quantum wells grown may be varied for alternate structures. A second graded index confinement layer 28 is grown on top of the quantum wells followed by a 0.02 $\mu$m P type InP layer 30.

Figure 1B:
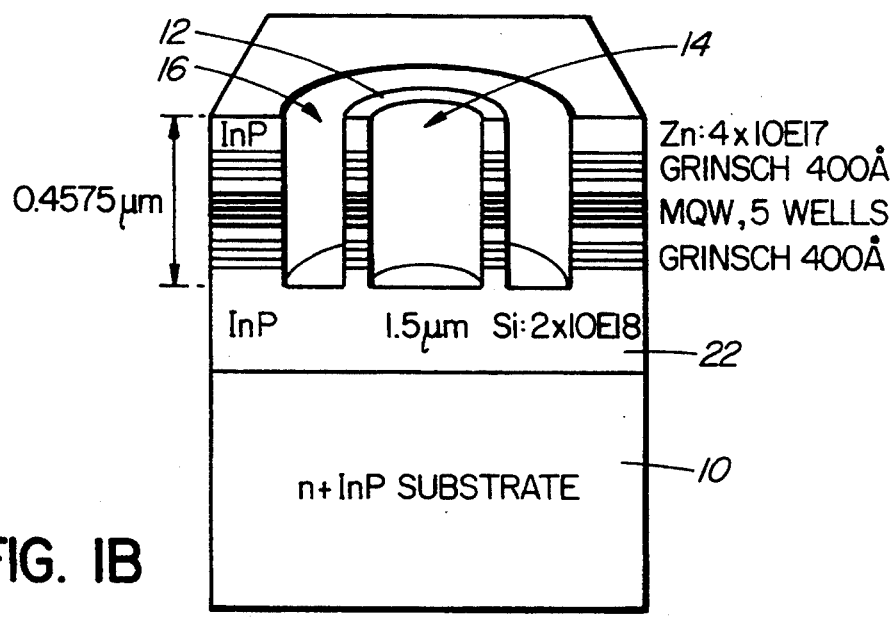
Figure 1C:
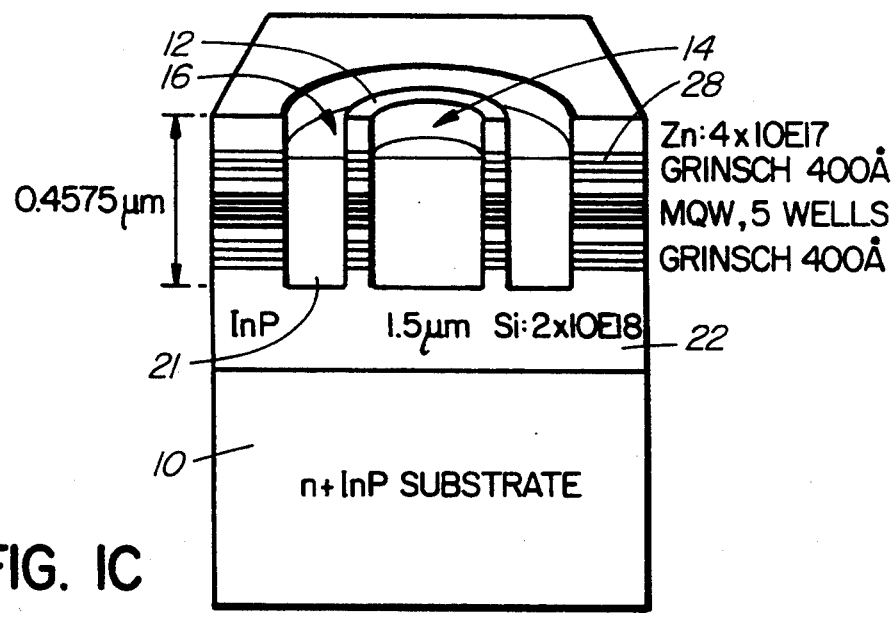
Figure 1D:
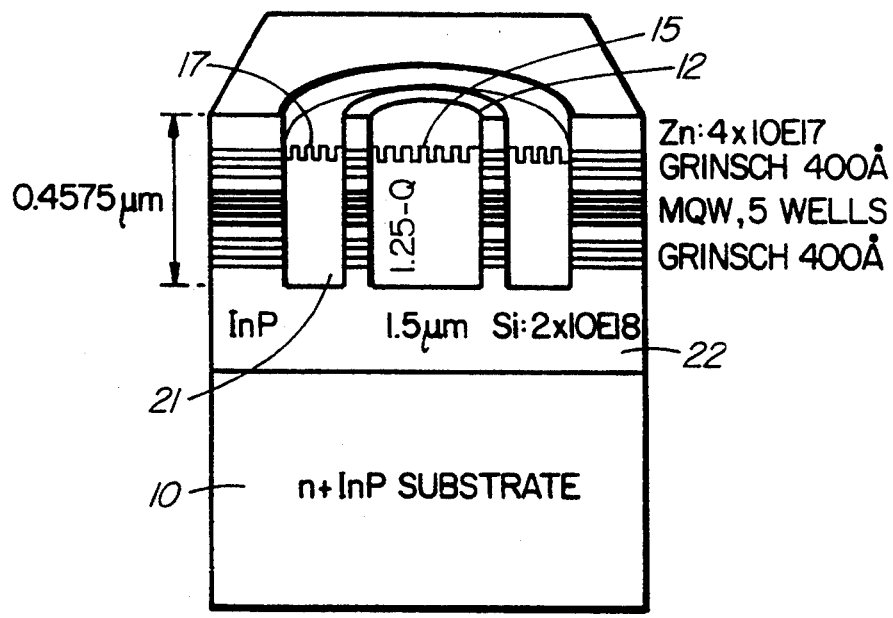
Figure 1E:
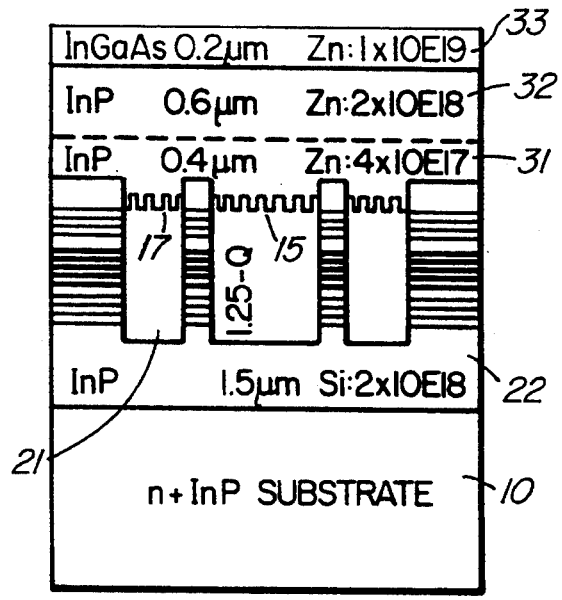

The next step with particular reference to FIG. 1B is the deposition of a layer of $SiO_2$ (not shown) on top of the P layer and a subsequently spun-on layer of Poly-Methyl-Methacrylate (PMMA) resist (not shown). The pattern defining the circular central region 14 and the annular region 16 is formed by photolithography. These regions are then etched through the quantum wells and the lower confinement layer using a Reactive Ion Etch (RIE) process. Semi-insulating InGaAsP 21 is regrown in the etched regions as illustrated in FIG. 1C. For a laser tailored to emit at 1.55 $\mu$m the regrowth layer 21 is selected to have a bandwidth of 1.25–1.3 $\mu$m i.e., transparent to the wavelength of the laser emission. Obviously a laser which is designed to emit at 1.3 $\mu$m will have a regrowth of material with a lower bandwidth 1.0 to 1.05 $\mu$m or example. It will be noted from FIG. 1C that the regrowth layer 21 fills the wells to approximately the height of the uppermost confinement layer 28. The residual $SiO_2$ is then removed and a new layer is deposited over the complete wafer. A layer of PMMA is spun on top of the $SiO_2$ and the first and second grating pattern is opened in the PMMA utilizing E-beam (electron beam) or focused ion beam (FIB) lithography. The pattern is then etched in the $SiO_2$ in the central and annular regions again using an RIE process. As shown in FIG. 1D the circular grating patterns 15, 17 are then transferred into the semi-insulating material by means of RIE. The pitch of the gratings is selected in accordance with the previously set out formulae (1) and (2). The grating has a symmetrical pattern i.e. the width of the grooves equals the width of the ridges. The SiO$_2$ is then removed and second regrown layers are formed on top of the circular gratings 15, 17 (FIG. 1E). The regrown material comprises a 0.4 $\mu$m 4×10$^{17}$ zinc doped layer 31, a 0.6 $\mu$m 2×10$^{18}$ zinc doped layer 32 and a contact layer 33.

Figure 1F:
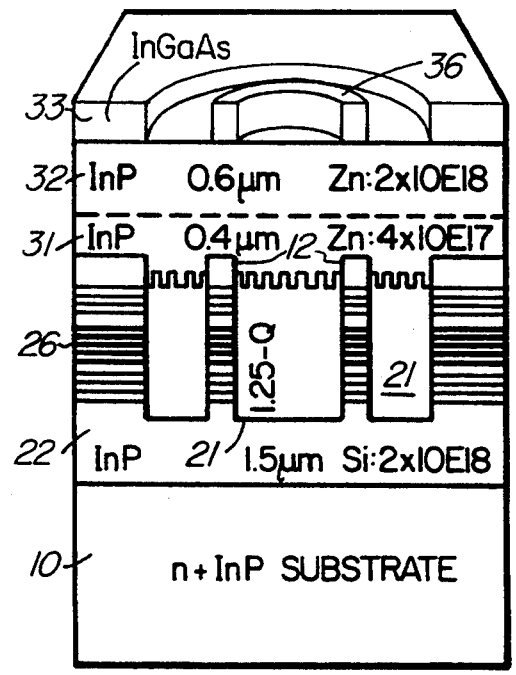
Figure 1G:
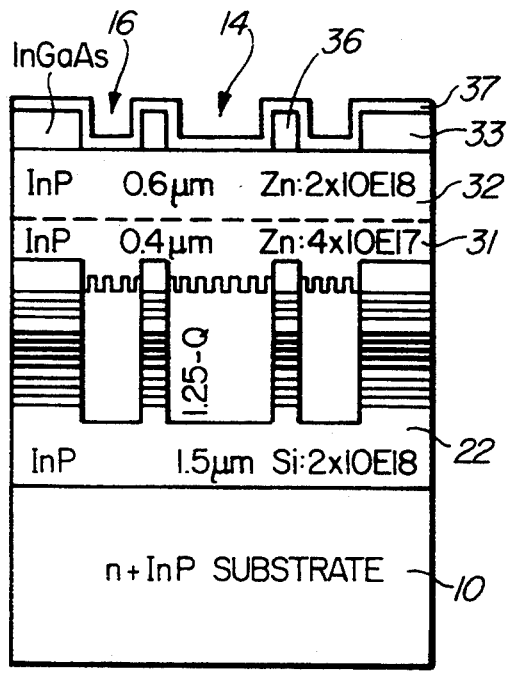
Figure 1H:
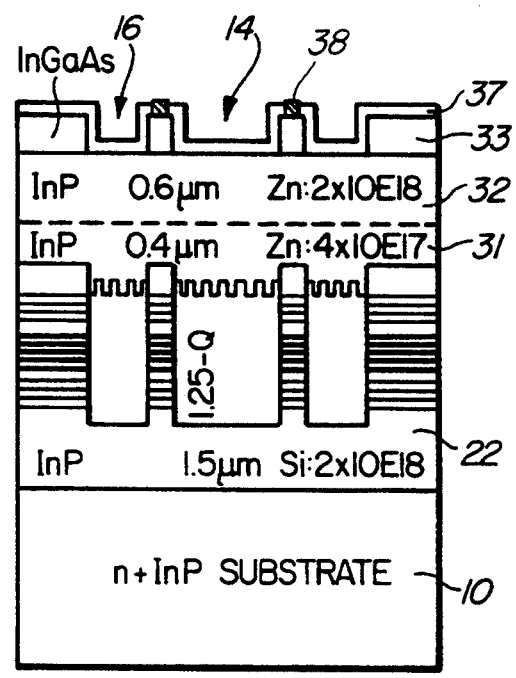
Figure 1I:
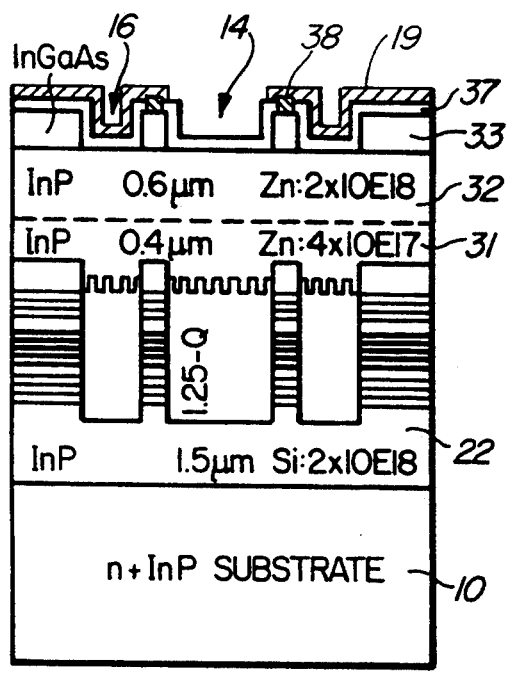
Figure 1J:
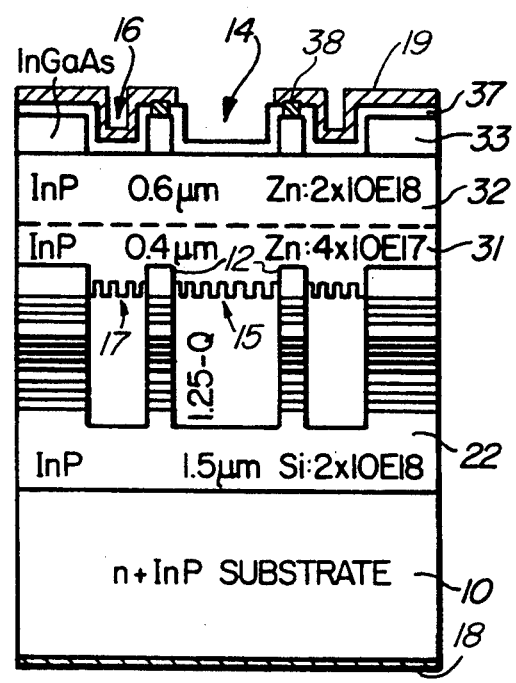

A circular ridge 36 as shown in FIG. 1F is etched in the contact layer 33 such that the ridge 36 is aligned with the annular active region 12. A further SiO$_2$ layer 37 is deposited on top of the etched surface (FIG. 1G) and contact openings are formed in the ridge by photolithography. P type contacts 38 as shown in FIG. 1H are deposited in the contact opening and these contacts 38 are interconnected at 19 as illustrated in FIG. 1I. Finally an N contact 18 is deposited on the bottom of the substrate to complete the lasing device shown in FIG. 1J.

In operation current injected into the active region 12 causes light to be generated in the quantum wells 26. This light propagates both inwardly toward the central second order grating region and outwardly toward the first order grating region. The first order gratings 17 reflects the light back to the active region and beyond to the central region. The second order gratings 15 in the central region 14 reflect some of the light back to the active region and some is diffracted upwardly to the surface by the second order grating. When the input current reaches threshold lasing action occurs and the output beam is emitted from the surface of the device. It will be apparent from FIG. 1J that the laser beam is emitted from the central circular region and hence not adversely affected by the P contact 19. Further the procedure and architecture allows for modifying the configuration of each of the critical regions i.e., active region, central grating area and, the annular grating area in order to optimize the performance of the device.

Figure 2A:
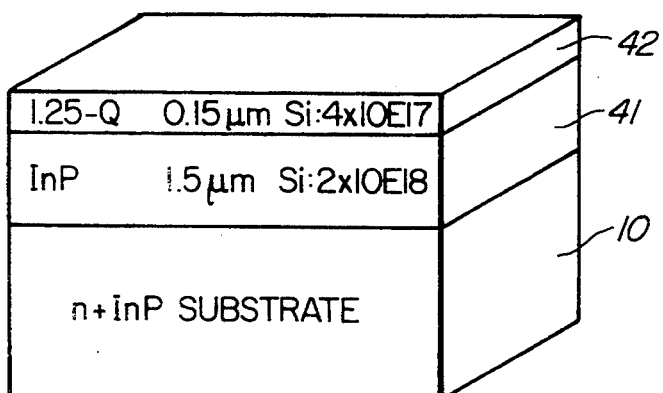
FIGS. 2A to 2L illustrate processing steps for a second embodiment of the invention.
Figure 2B:
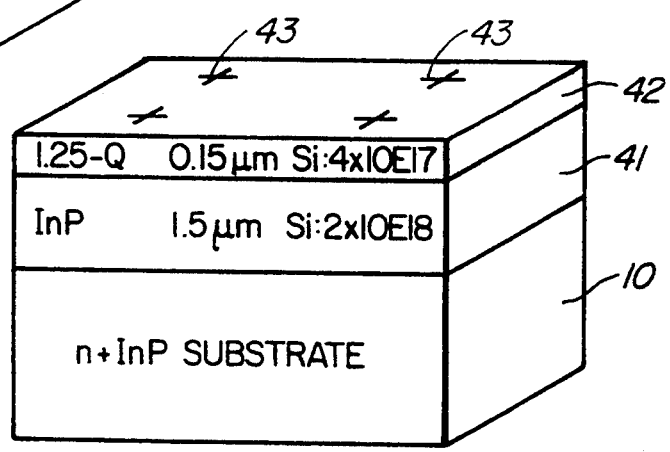
Figure 2C:
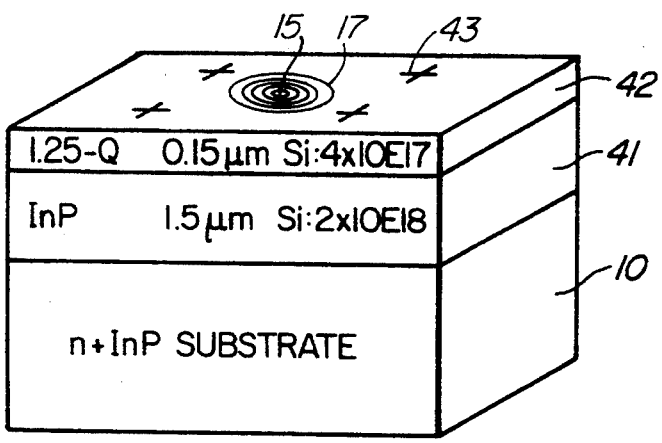
Figure 2D:
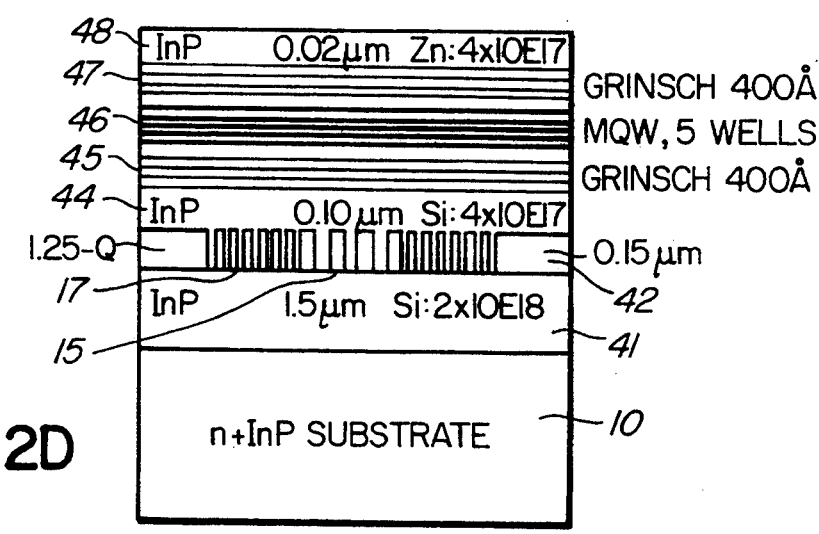
Figure 2E:
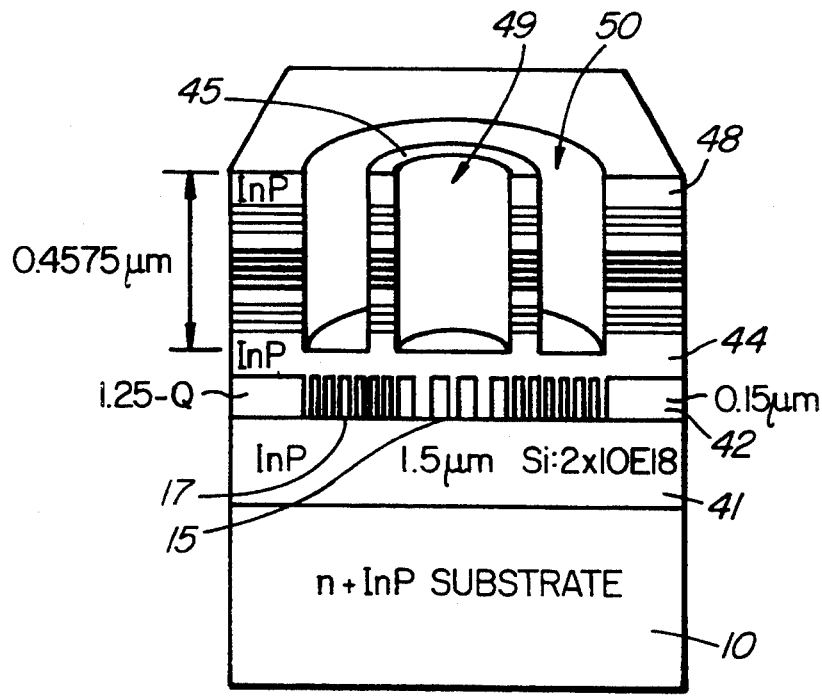
Figure 2F:
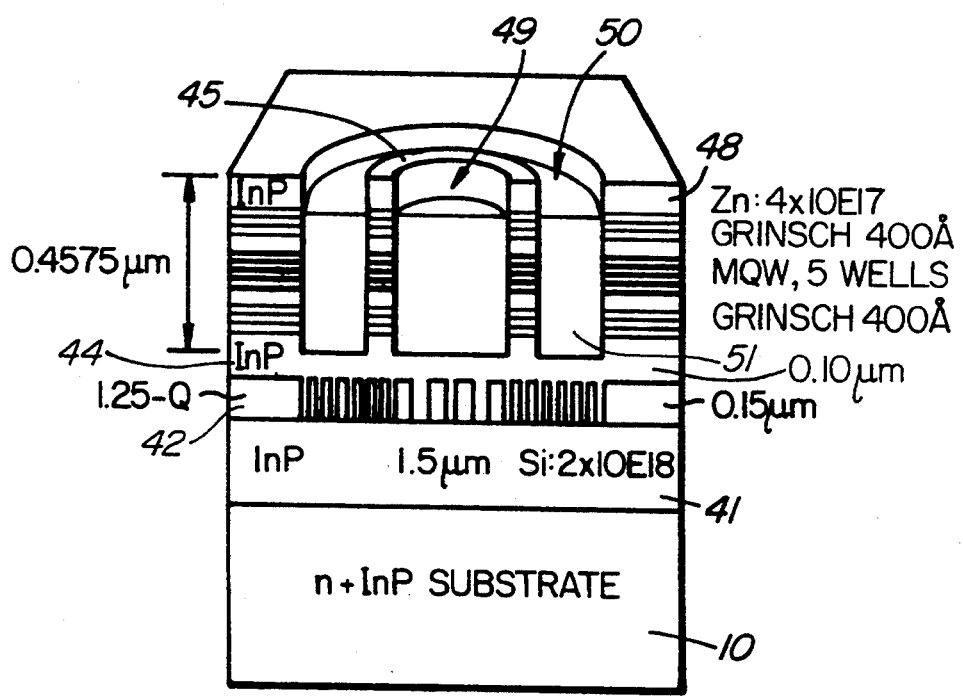
Figure 2G:
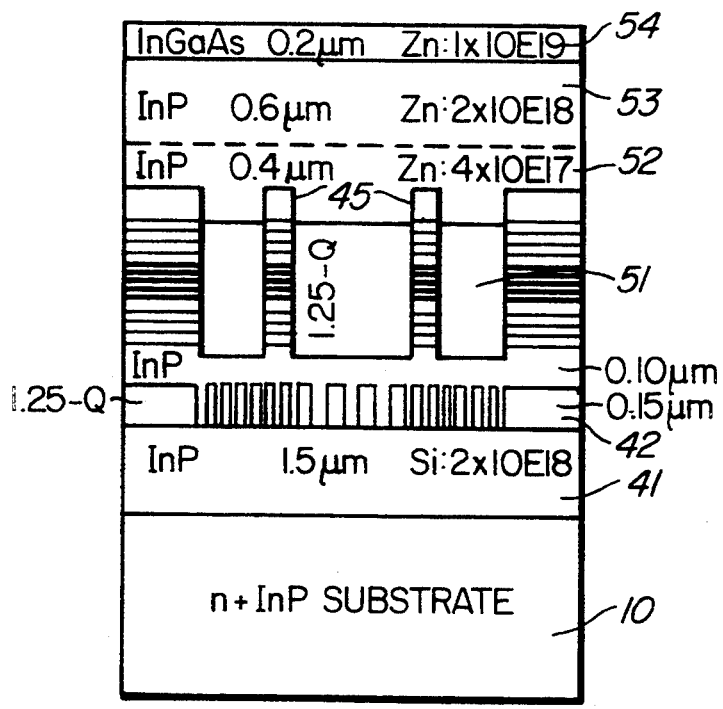
Figure 2H:
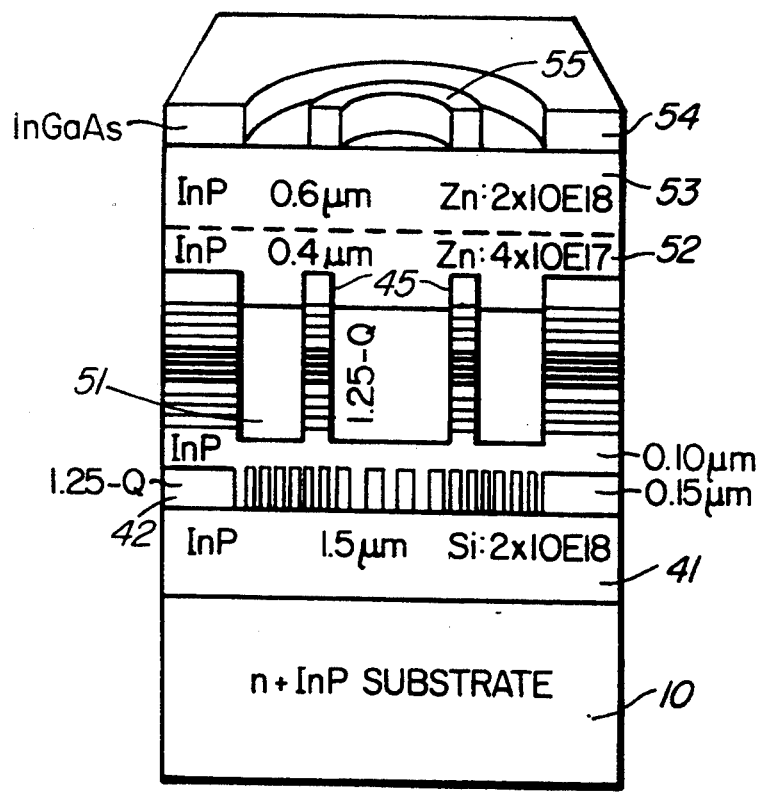
Figure 2I:
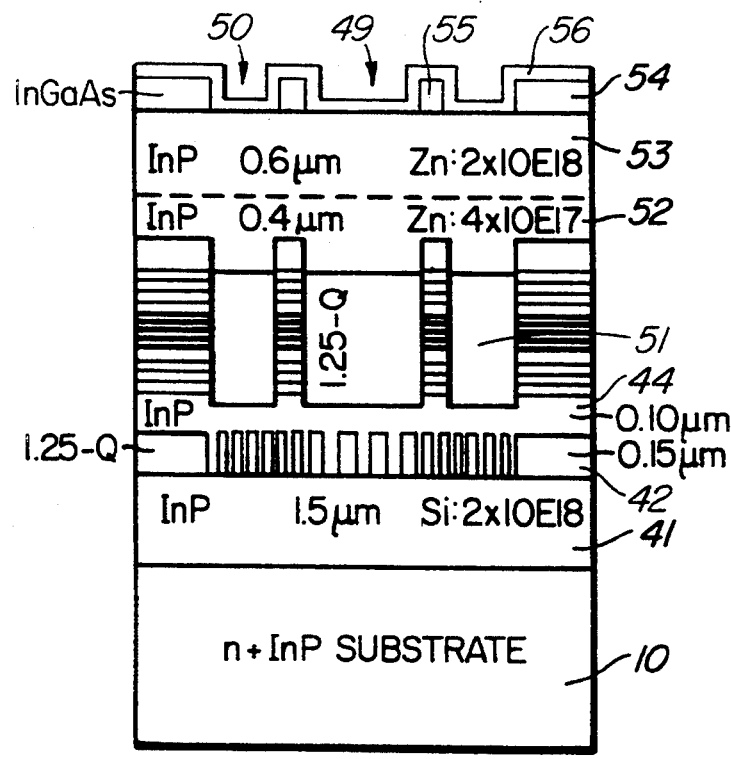
Figure 2J:
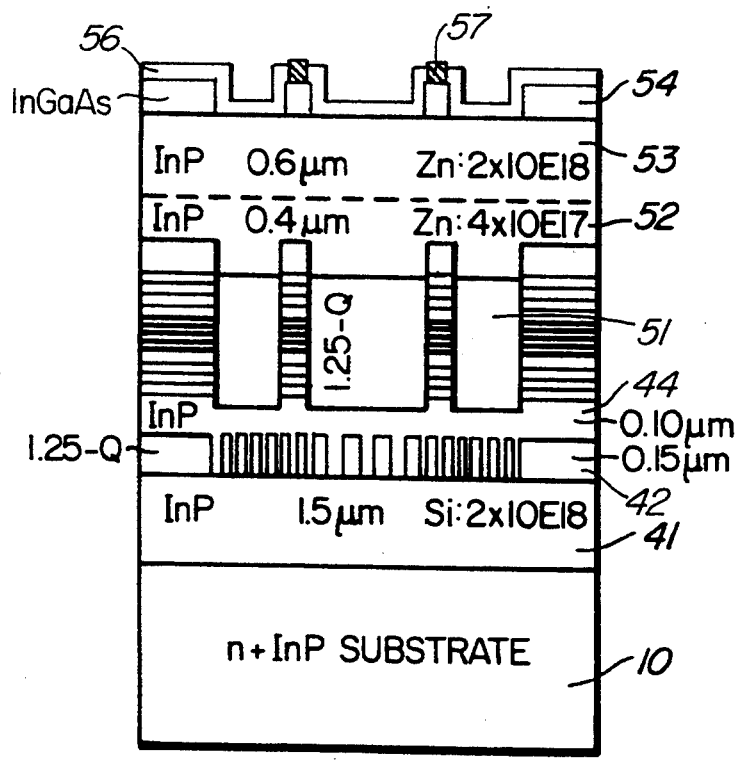
Figure 2K:
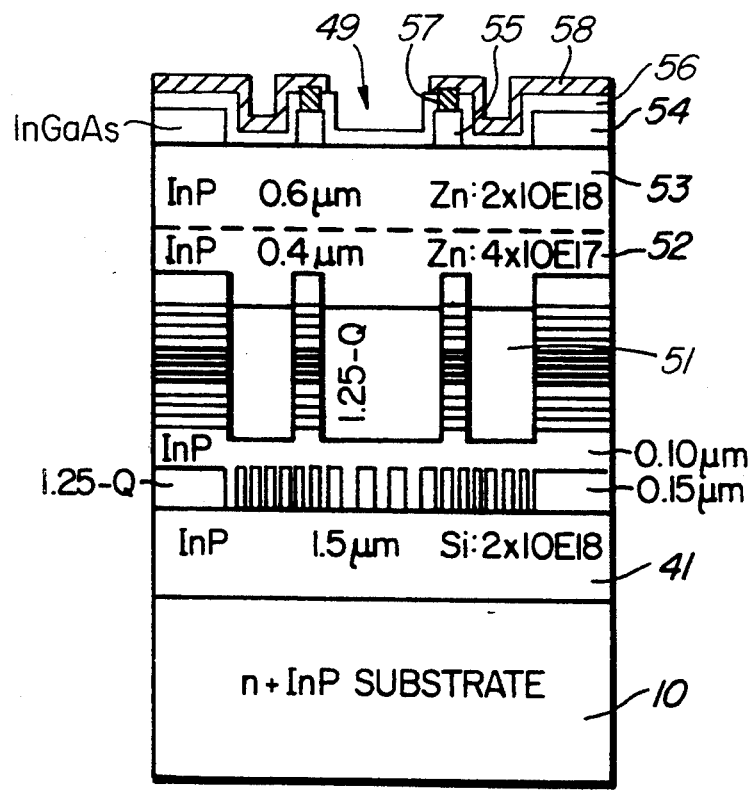

A second procedure for fabricating a circular grating laser is shown in FIGS. 2A to 2L. In this procedure the first step as shown in FIG. 2A comprises the growth of 1.5 $\mu$m N type buffer layer 41 and an N type grating layer 42 of InGaAsP having a Q of 1.25–1.30 $\mu$m on the N type InP substrate 10. An SiO$_2$ layer (not shown) is deposited on the grating layer followed by a spun-on layer of PMMA (not shown). Reference marks 43 (FIG. 2B) and the first and second order gratings 17, 15 are defined in the grating layer 42 using FIB and RIE (see FIG. 2C). The remaining SiO$_2$ is then removed from the grating and the wafer is further processed to provide an overgrowth of a 0.10 $\mu$m buffer layer 44 of InP followed by the confinement/quantum wells/confinement structure 45, 46, 47 and a P type InP buffer layer 48 as shown in FIG. 2D. Utilizing SiO$_2$ and PMMA the central and annular patterns 49, 50 are defined by photolithography. The mesa is etched by RIE. As illustrated in FIG. 2E the central region 49 and the annular region 50 are etched through the quantum wells to the N type buffer layer 44. This leaves annular mesa 45. The central circular and annular etched regions 49, 50 are regrown with semi-insulating InGaAsP 51 having a bandgap in the range 1.25 to 1.30 $\mu$m as illustrated in FIG. 2F. P type InP 52, 53 is then grown on the semi-insulating layer followed by a heavily doped P layer 54 of InGaAs (FIG. 2G). The upper P layer 54 is selectively etched to form an annular ridge 55 as best seen in FIG. 2H. A top layer of SiO$_2$ 56 is deposited over the etched upper surface (FIG. 2I) and contact openings are etched in this layer. P contacts 57 are deposited in these openings as shown in FIG. 2J. The P contacts are interconnected as best seen at 58 in FIG. 2K. Finally an N contact 59 is added to complete the structure shown in FIG. 2L.

Figure 2L:
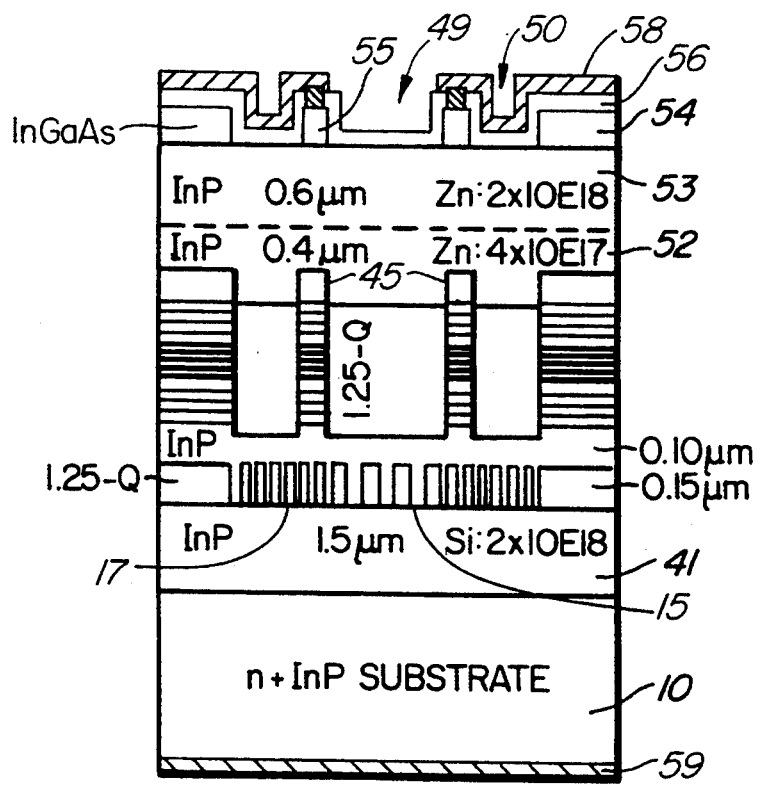

Operation of the circular grating laser of the configuration as shown in FIG. 2L is similar to operation of the device of FIG. 1K. Current injected into the active region 45 via the annular ridge structure 55 generates the necessary light and gain to promote lasing action. The light directed radially outward into the annular semi-insulating region 51 is reflected inwardly by the first order grating 17. Some of the light traveling towards the central region 49 is diffracted perpendicularly to the surface by the second order grating 15. Above threshold coherent light is emitted from the surface in the central region.

Figure 3A:
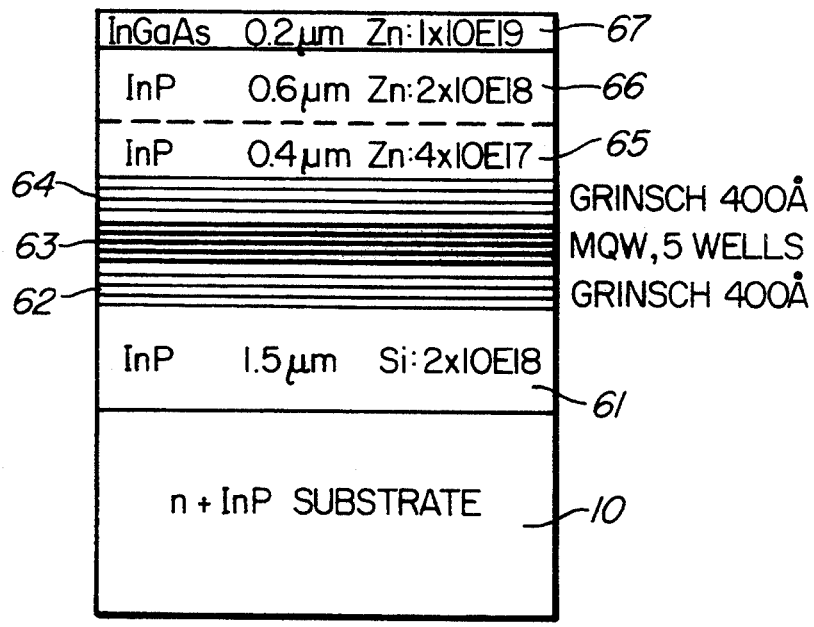
Figure 3B:
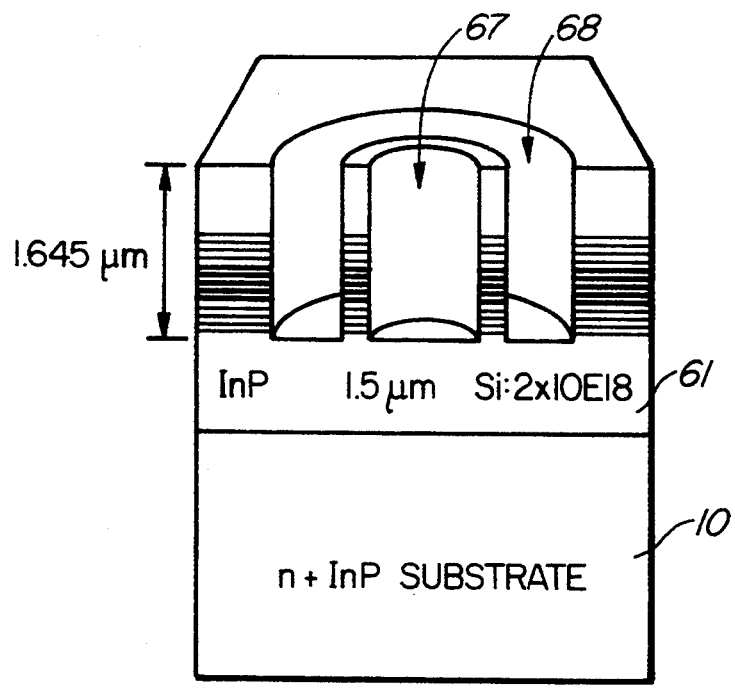
Figure 3C:
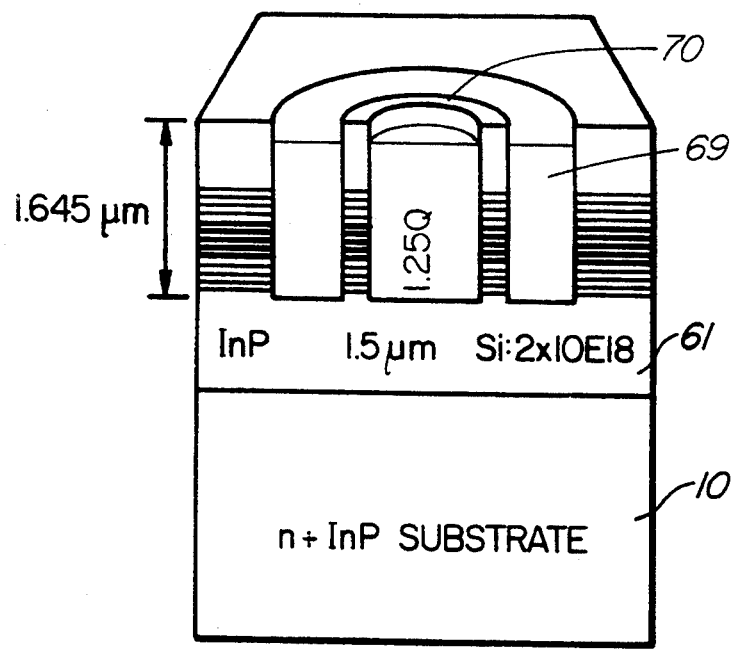
Figure 3D:
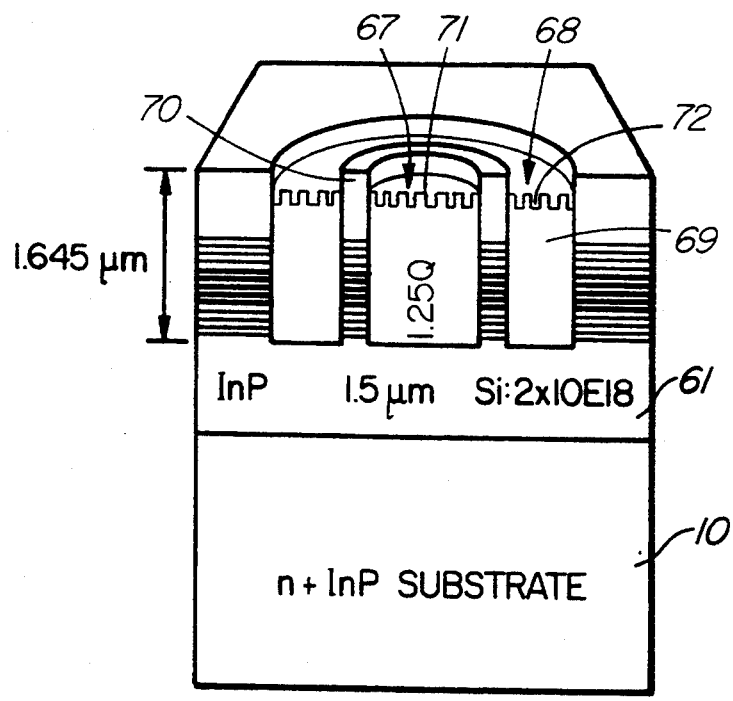

A third procedure for fabricating a circular grating laser according to the invention is illustrated in FIGS. 3A to 3H. Utilizing known growth techniques the various layers shown in FIG. 3A are grown on a N type InP substrate 10. These layers include an N type InP buffer layer 61, the confinement/quantum wells/confinement layers 62, 63, 64, P type InP buffer layers 65, 66, and a heavily P doped InGaAs capping layer 67. Utilizing the previously described RIE process the central and annular regions 67 and 68 respectively are etched through the quantum wells 63 and lower confinement layer 62 to the N type buffer layer 61 as illustrated in FIG. 3B. These etched channels 67, 68 are regrown with semi-insulating InGaAsP 69 having a bandgap of 1,25 to 1,30 $\mu$m. As illustrated in FIG. 3C this regrowth does not completely fill the central and annular regions thereby leaving an annular ridge 70 over the active region. Again utilizing the E beam or FIB and RIE processes previously described a second order grating 71 is formed in the central region 67 and a first order grating 72 is formed in the annular region 68 as best seen in FIG. 3D. A relatively thick layer of SiO$_2$ 73 is deposited on top of the structure (FIG. 3E) and P type contacts 74 are formed in openings in the SiO$_2$ on the ridge as shown in FIG. 3F. As shown at 75 in FIG. 3G the P contacts are interconnected and an N contact 76 is formed to create the structure shown in FIG. 3H.

Operation of the laser according to this fabrication process is the same as previously described in relation to FIGS. 1A to 1K and 2A to 2L.

Figure 4A:
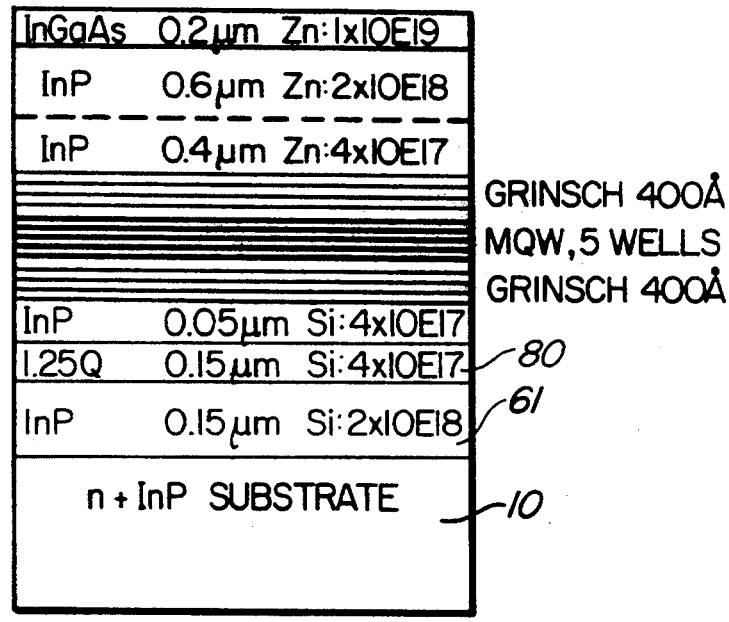
FIGS. 4A to 4E illustrate processing steps for a fourth embodiment of the invention.
Figure 4B:
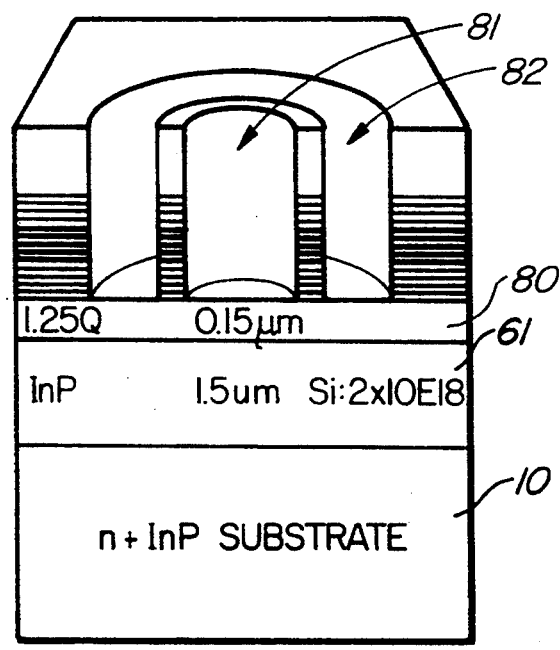
Figure 4C:
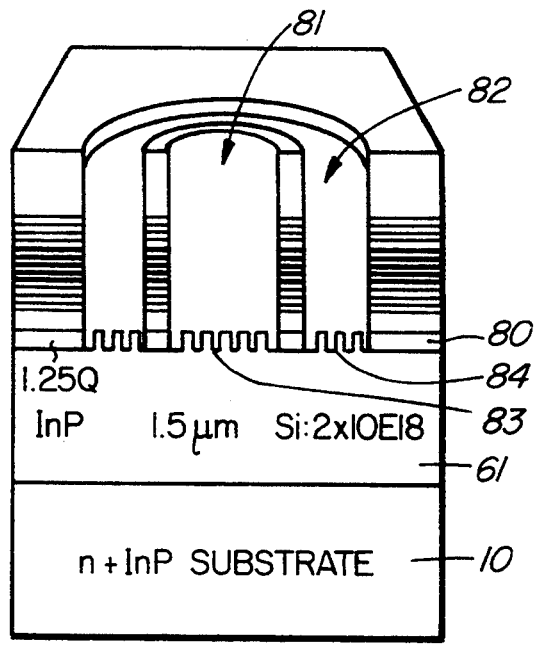
Figure 4D:
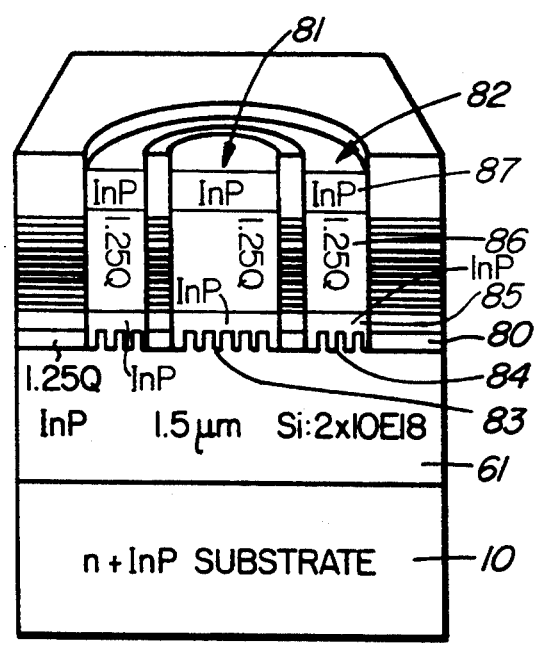
Figure 4E:
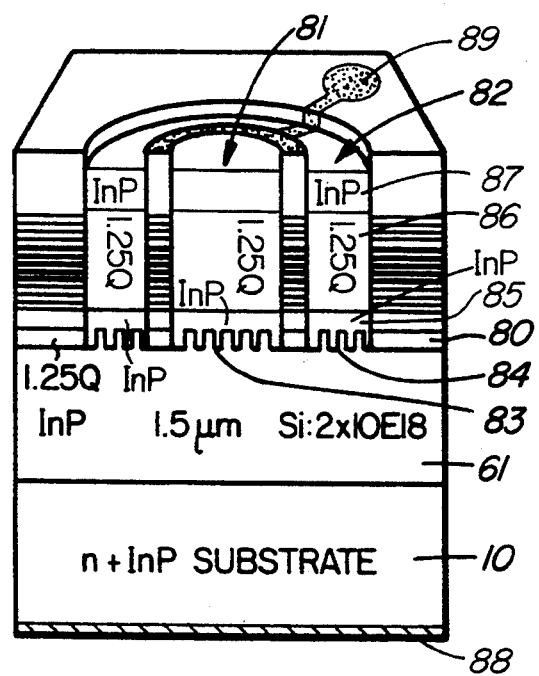

A fourth procedure for fabricating a circular grating laser according to the present invention is shown in FIGS. 4A to 4E. The initial crystal growth procedure (FIG. 4A) is similar to that described in relation to FIG. 3A except that a 0.15 $\mu$m grating layer 80 of InGaAsP is grown prior to the confinement/quantum well layers. As shown in FIG. 4B the circular central region 81 and annular region 82 are then etched down to the top of the grating layer 80, by the RIE process previously discussed. As shown in FIG. 4C the second order grating 83 is etched in the circular central region 81 and the first order grating 84 is etched in the annular region 82 by the processes previously described. The structure is then regrown to almost completely fill the etched regions with a buffer layer 85, a semi-insulating layer 86 of InGaAsP and second InP buffer layer 87. This configuration is shown in FIG. 4D. Finally P and N contacts 89, 88 respectively are added to complete the structure as illustrated in FIG. 4E.

FIGS. 5A to 5D are cross sectional views illustrating the fabrication procedure of a 0.98 $\mu$m circular grating, surface-emitting laser according to another aspect of the invention. This device is fabricated in a GaAs/AlGaAs heterojunction structure and, unlike the previously discussed embodiments does not require etching through the active region nor, consequently, any regrowth.

Figure 5A:
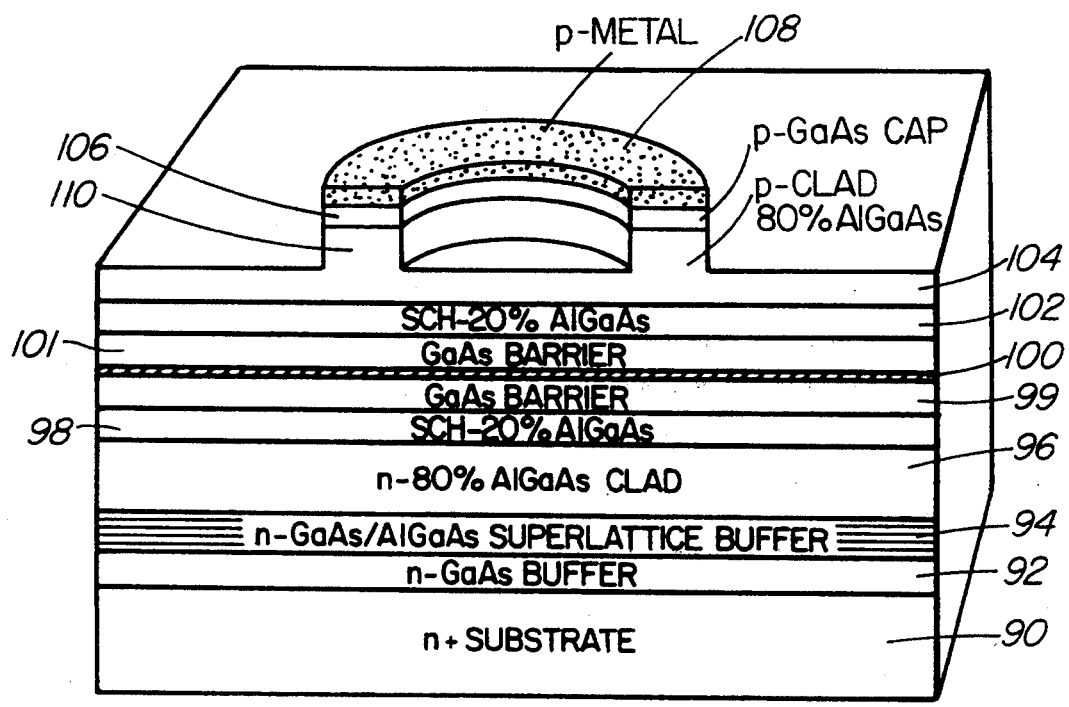
FIGS. 5A to 5D are cross-sectional views of a further structure according to the invention.
Figure 5B:
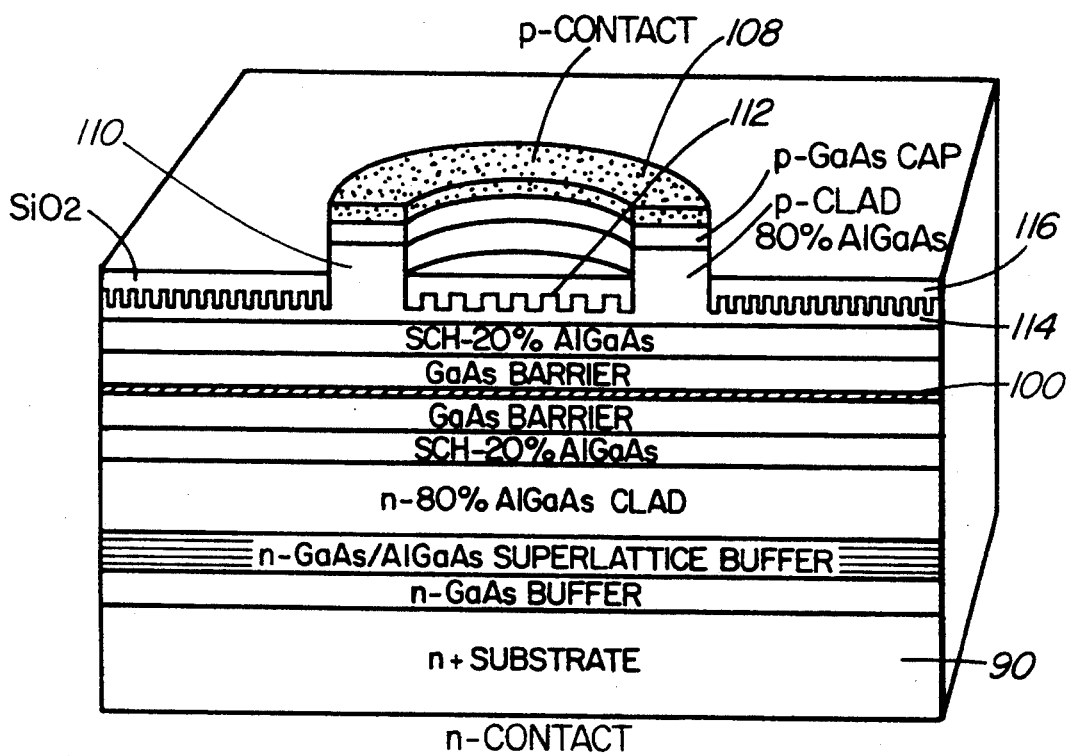
Figure 5C:
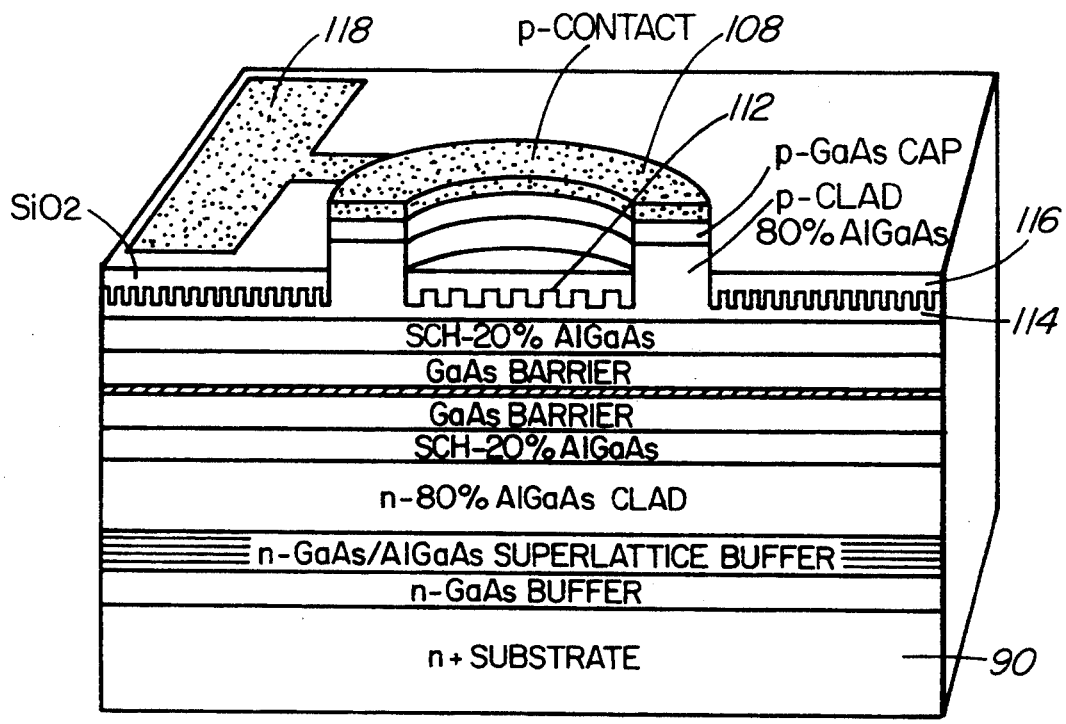

As shown in FIG. 5A N type GaAs is selected as the substrate 90 onto which is sequentially grown a N type GaAs buffer 192, a N type GaAs/AlGaAs superlattice buffer 94, a AlGaAs cladding layer 96, a confinement layer 98, a single quantum well 100 having a GaAs barrier 99, 101 on each side, an upper confinement layer 102, a P type AlGaAs cladding layer 104 and a P type GaAs cap 106. A layer of p-metal contact material 108 is deposited on top of the cap 106. PMMA is spun onto the p-metal layer 108 which is processed photolithographically to produce the annular contact pattern shown in FIG. 5A. The p-metal in this annular configuration serves as a self aligned mask for mesa etching of the annular ridge 110 through the cap layer and into the top cladding layer 104 as also seen in FIG. 5A. Next first and second order gratings are formed by the FIB and RIE process previously described resulting in a second order grating 112 in the central region and a first order grating 114 in the region surrounding the mesa or ridge 110. As best seen in FIG. 5B a relatively thick deposition of SiO$_2$ 116 is formed on top of the etched gratings 112, 114. Next the annular P contact is interconnected to a bonding pad 118 as shown in FIG. 5C. Finally an N contact 120 is added to the substrate 90 to complete the device as shown in FIG. 5D.

Figure 5D:
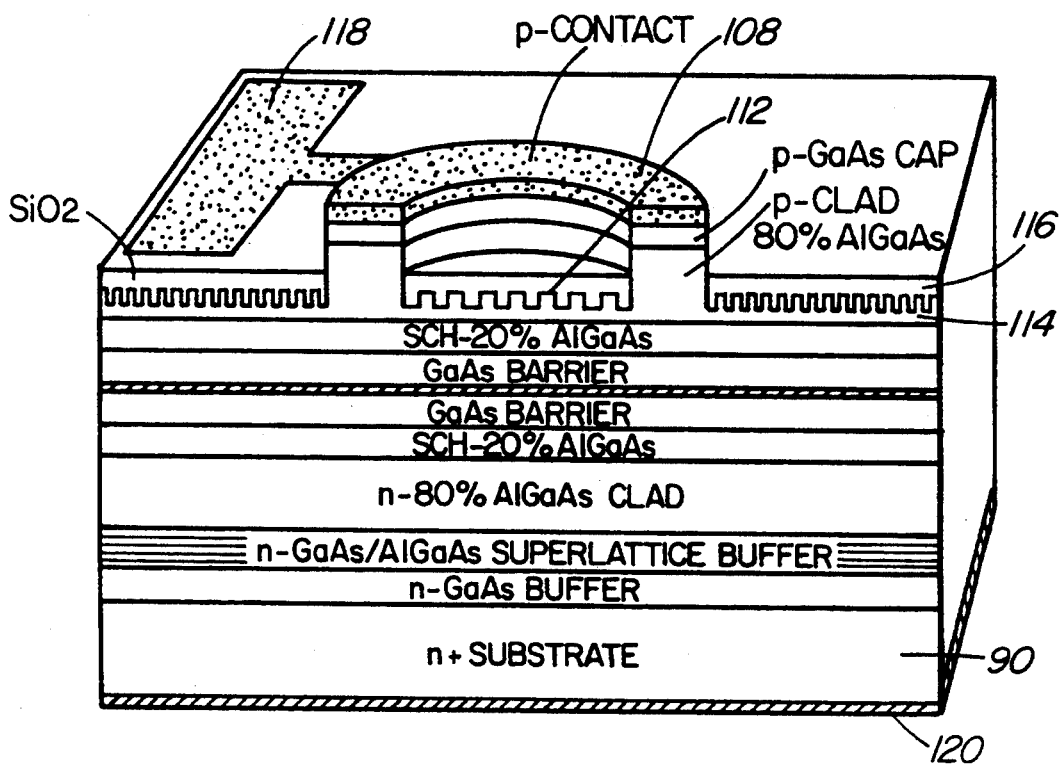

Operation of the lasing device of FIG. 5D is substantially the same as described in relation to FIG. 1K. Light generated in the active region 100 under the annular ridge contact 108 which propagates radially outward is reflected inwardly by the first order grating 114. At threshold the laser beam is directed normally to the waveguide by the central second order grating 112.

Figure 6:
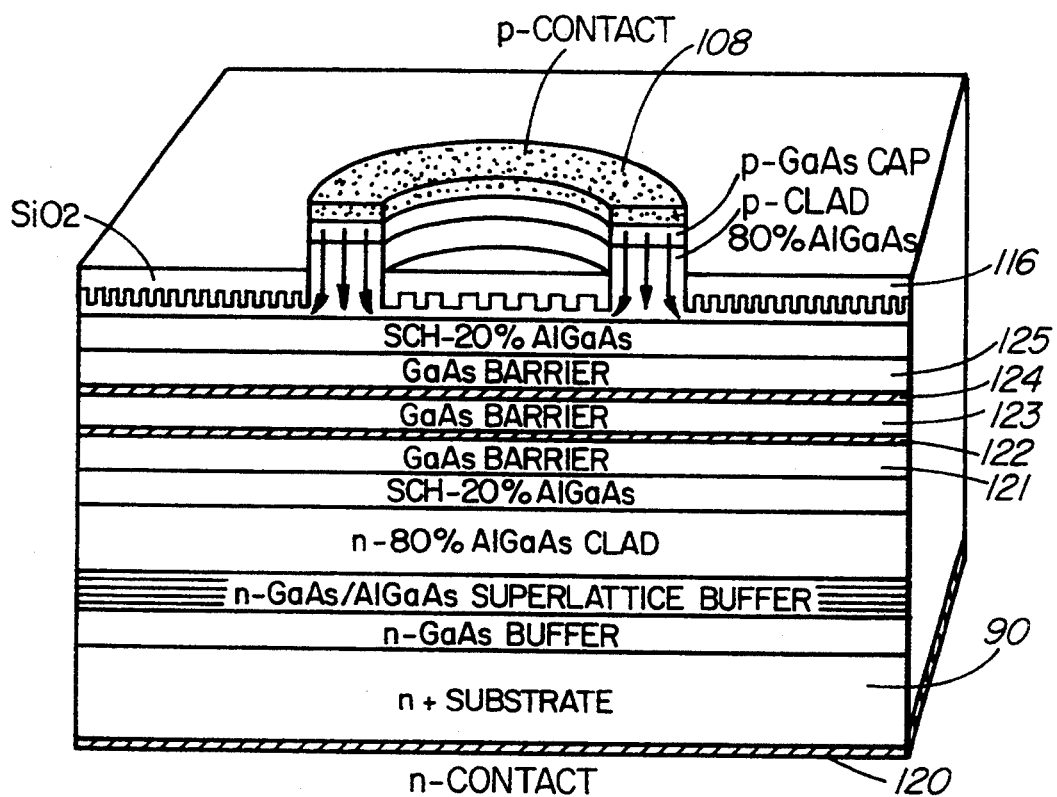
FIG. 6 is a cross-sectional view of a modified version of the device of FIGS. A to 5D.

FIG. 6 illustrates a device structure similar to that which is shown in FIGS. 5A to 5D except that in the growth process two quantum wells 122, 124 and three GaAs barrier layers 121, 123, 125 are incorporated. Otherwise the fabrication processing steps and operation are the same as discussed in relation to FIGS. 5A to 5D.

The foregoing description has generally defined the central circular grating as a second order grating. It is possible however to fabricate a surface emitting laser wherein the central grating is of a higher order. Further, the central grating as described and illustrated with reference to FIGS. 1 to 6 comprises a uniform pitch although it is to be understood that the pitch may, in fact, be non-uniform. By selectively tailoring the pitch and amplitude of the central grating corrugations it is possible to achieve beam focusing.

Figure 7A:
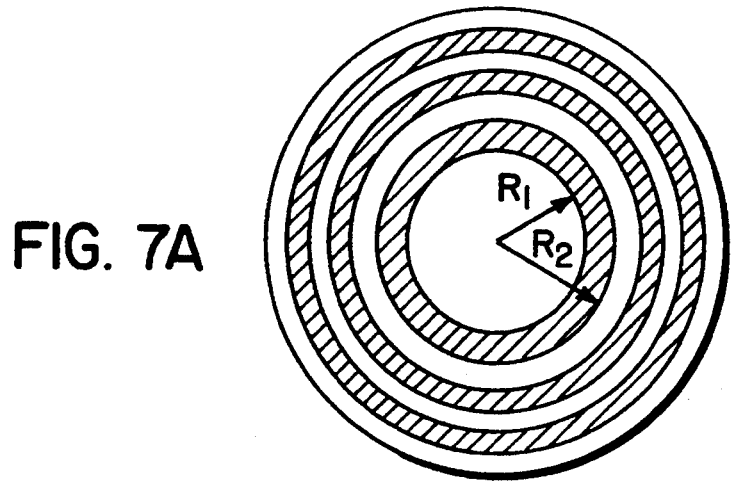
FIG. 7A is a schematic diagram of a binary-phase Fresnel lens.

One way to do this is to replace the previously described second order central grating with a binary phase Fresnel lens. A diagram of a binary phase Fresnel lens is shown in FIG. 7A. The radius of the m$^{th}$ zone (Rm) in a Fresnel lens as discussed by K. Rastani et al, "Binary Phase Fresnel Lenses for Generation of Two Dimensional Beam Arrays", Applied Optics, Vol. 30, No. 11, p. 1347, 1991, is given by:

$$R_m^2 = mR_1^2 \tag{3}$$

where $R_1$ is the radius of the inner zone (FIG. 7A).

The focal length $f_1$ of the primary focus is described by:

$$f_1 = \frac{R_1^2}{\lambda} \tag{4}$$

where $\lambda$ is the light wavelength. Thus, from (4), we have:

$$R_1 = \sqrt{\lambda f_1} \tag{5}$$

Therefore, to design a Fresnel lens with a focal length ($f_1$) of 100 μm, the radius $R_1$ of the inner zone is:

$$\begin{aligned} R_1 &= \sqrt{\lambda f_1} \\ &= \sqrt{1.55 \times 100} \\ &= 12.45 \, \mu m. \end{aligned}$$

Figure 7B:
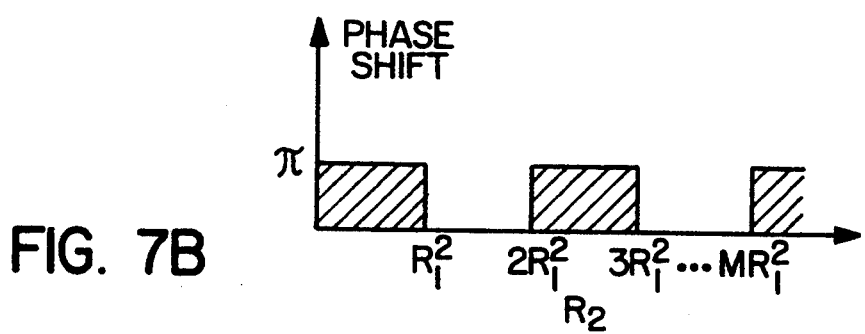
FIG. 7B shows the phase shift induced by the lens of FIG. 7A as a function of $R^2$.

The π-phase shift between neighboring zones as illustrated in FIG. 7B is obtained by requiring the grating height d to satisfy:

$$d = \frac{\lambda}{2\Delta n} \tag{6}$$

ps Where Δn is the change in refractive index between the neighboring zones.

Figure 8:
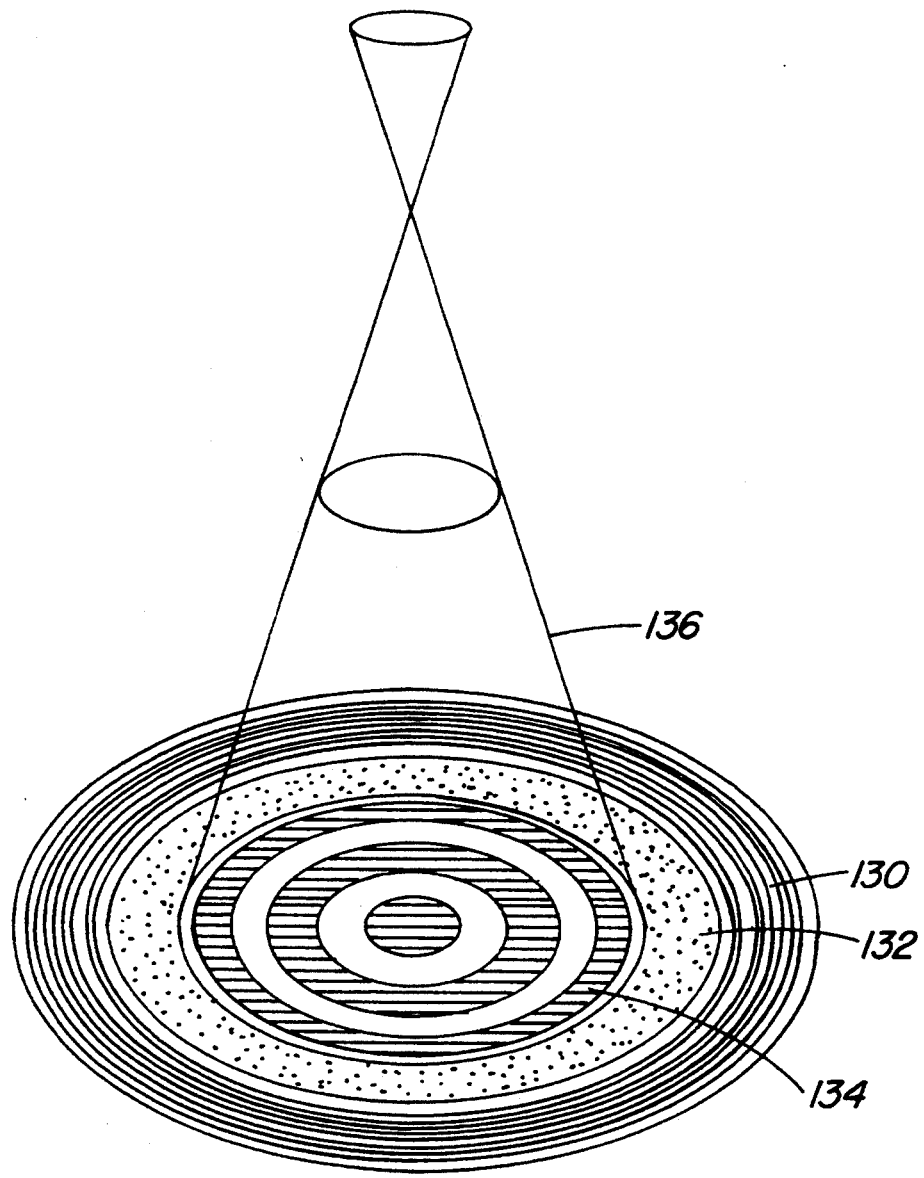
FIG. 8 is a top perspective view of a SEL with a central Fresnel lens.

FIG. 8 is a top perspective view of circular grating laser with a Fresnel lens at the center. As shown in FIG. 8 the first order circular grating 130 surrounds the annular contact 132 which as discussed previously is aligned vertically with the annular active region (not shown). The circular Fresnel lens 134 is located within the annular contact region 132 and hence the focused output beam 136 is not affected by the contact.

Figure 9:
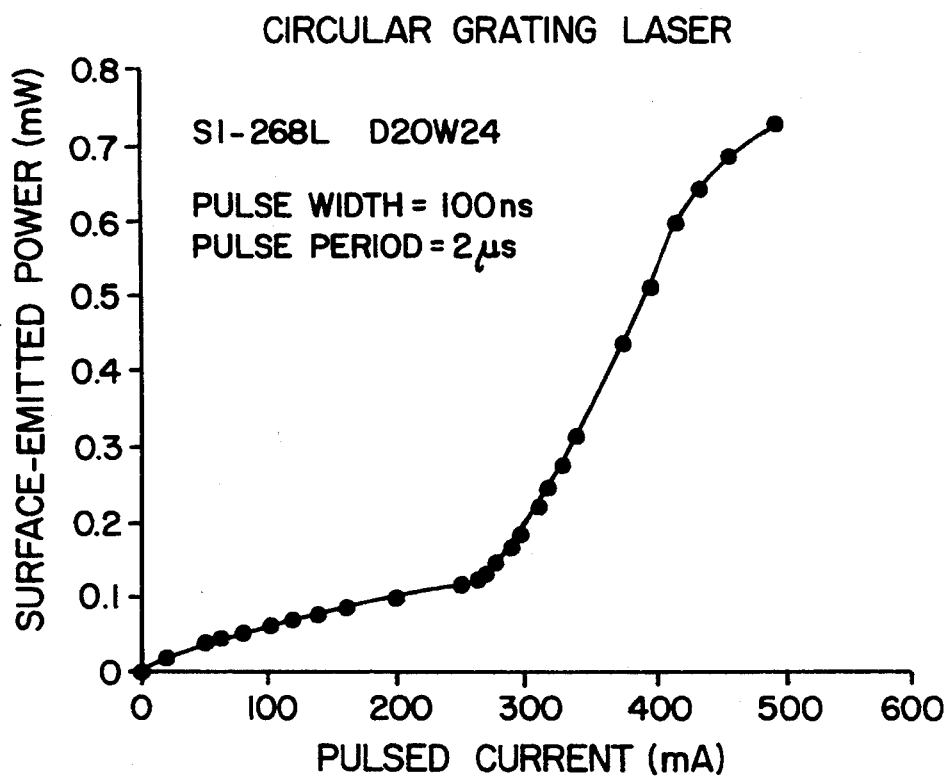
FIG. 9 is a L-I curve for a device fabricated in accordance with FIGS. 1A-1K.
Figure 10:
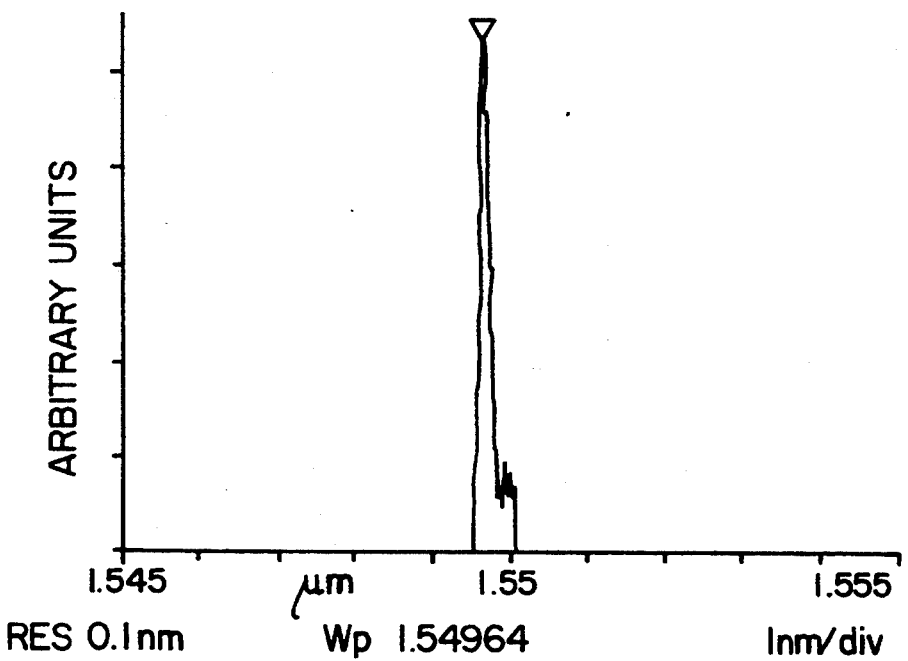
FIG. 10 is a spectrum of the device of FIG. 9.

The concept presented in the present application has been demonstrated by preliminary devices fabricated in accordance with the processing steps set out in FIGS. 1A to 1K. FIG. 9 is an example of the L-1 curve showing the sharp increase in output power consistent with lasing action. FIG. 10 illustrates the corresponding emission spectrum of the device of FIG. 9 having a lasing wavelength of 1.54964 μm.

Devices fabricated in accordance with the embodiments of FIGS. 5A–5D and FIG. 6 provide surface emission at a wavelength of approximately 0.98 μm consistent with the GaAs/AlGaAs alloy structure.

While certain specific embodiments of the invention have been described it will be apparent to one skilled in the art that other alternatives or variation are possible. It is to be understood, however, that such alternatives or variations will fall within the scope of the invention as defined by the appended claims.

I claim:

1. A surface emitting, semiconductor lasing device comprising;
    a substrate;
    an annular active region on said substrate, said active region including material capable of generating light and gain for lasing action;
    a central, circular region having a circular grating to effect surface emission;
    an annular region surrounding said active region, said annular region having a first order grating to reflect light generated in said active region back to said active region and said central region; and contacts on said device for introducing current to said active region to initiate lasing action.

2. A surface emitting lasing device as defined in claim 1, the circular grating in the central region being a higher order grating.

3. A surface emitting lasing device as defined in claim 1, the circular grating in the central region being a second order grating.

4. A surface emitting lasing device as defined in claim 1, the circular grating in the central region having a uniform pitch.

5. A surface emitting lasing device as defined in claim 1, the circular grating in the central region having a non-uniform pitch.

6. A surface emitting lasing device as defined in claim 1, the circular grating in the central region being a binary-phase Fresnel lens.

7. A surface emitting lasing device as defined in claim 6, the amplitude and radius of the Fresnel lens gratings being tailored to focus the surface emission.

8. A surface emitting lasing device as defined in claim 1 wherein each of said annular active region, said central circular region and said annular region surrounding said active region may be tailored independently in order to optimize said surface emission.

9. A surface emitting lasing device as defined in claim 1, the active region having a quantum well.

10. A surface emitting lasing device as defined in claim 1, said active region having a plurality of quantum wells each separated by a barrier layer.

11. A surface emitting lasing device as defined in claim 10, said active region having five quantum wells and four barrier layers.

12. A surface emitting lasing device as defined in claim 10, said active region having separate confinement layers on each side of said quantum well.

13. A surface emitting lasing device as defined in claim 1, the circular central region and the annular region including semi-insulating material having a bandgap wavelength shorter than the lasing wavelength of the lasing device.

14. A surface emitting lasing device as defined in claim 1, said substrate being N-type InP.

15. A surface emitting lasing device as defined in claim 1, said substrate being N-type GaAs.

16. A method of fabricating a surface emitting, semiconductor lasing device comprising the steps of:
  a) epitaxially growing on a substrate active material capable of generating light and gain for lasing action;
  b) selectively etching said active material so as to form an annular mesa active region having a central circular etched region and an annular etched region surrounding said active region;
  c) regrowing semi-insulating material in said central circular etched region and said annular etched region;
  d) forming a first order grating on said annular regrown region and a circular grating on said central circular regrown region; and
  e) forming contacts on said substrate and said annular active region.

17. A method as defined in claim 16, the circular grating in the central region being a second order grating.

18. A method as defined in claim 16, the circular grating in the central region being a binary-phase Fresnel lens.

19. A method as defined in claim 16 including the steps a) to d) followed by:
  e) epitaxially growing doped semi-conductor material on top of said first and second gratings and active region;
  f) etching an annular ridge in said doped semi-conducting material, said ridge being aligned with said annular active region; and
  g) forming contacts on said substrate and annular ridge.

20. A method of fabricating a surface emitting, semiconductor lasing device comprising the steps of:
  a) epitaxially growing doped semiconductor material on a doped substrate the grown material being of the same type as the substrate;
  b) forming circular gratings on said grown material, said gratings comprising a central circular grating in a central circular region and a first order grating in an annular region surrounding said central circular region;
  c) epitaxially growing active material capable of generating light and gain for lasing action on said circular gratings, said active material including material of the opposite type to said substrate;
  d) etching said active material to from an annular mesa active region with an etched central circular region and an etched annular region said central region being aligned with said second order grating and said annular etched region aligned with said first order grating;
  e) regrowing said etched regions with semi-insulating material;
  f) regrowing doped semi-conducting material on said semi-insulating and said annular active region, said doped regrown material being of the opposite type as the substrate;
  g) etching an annular ridge in said doped regrown material, said etched ridge being aligned with said annular active region; and
  h) forming contact on said substrate and said etched ridge.

21. A method as defined in claim 20, the central circular grating being a second order grating.

22. A method as defined in claim 20, the central circular grating being a binary-phase Fresnel lens.

23. A method of fabricating a surface emitting, semiconductor lasing device comprising the steps of:
  a) epitaxially growing semiconducting material on a substrate, said semi-conducting material including an active material capable of generating light and gain for lasing action and a capping layer on said active layer;
  b) etching an annular mesa in said capping layer leaving a central circular etched surface and an etched surface surrounding said mesa;
  c) forming circular gratings on the etched surface, said circular gratings comprising a central circular grating in said central circular etched surface and a first order grating in said etched surface surrounding said mesa;
  d) depositing a protective dielectric layer on said circular gratings; and
  e) forming contacts on said substrate and said annular mesa.

24. A method as defined in claim 23, the central circular grating being a second order grating.

25. A method as defined in claim 23, the central circular grating being a binary-phase Fresnel lens.

* * * * *

UNITED STATES PATENT AND TRADEMARK OFFICE
CERTIFICATE OF CORRECTION

PATENT NO. : 5,448,581
DATED : September 5, 1995
INVENTOR(S) : Chun-Meng Wu, Toshihiko Makino It is certified that error appears in the above-indentified patent and that said Letters Patent is hereby corrected as shown below:

On the cover page at [75]

after "Nepean" delete ", both of" and insert

--; Mikelis Nils Svilans, Kanata, all of --.

Signed and Sealed this

Ninth Day of January, 1996

Attest:

BRUCE LEHMAN

*Attesting Officer*  *Commissioner of Patents and Trademarks*